US012575142B2

(12) United States Patent
Ikeura et al.

(10) Patent No.: US 12,575,142 B2
(45) Date of Patent: Mar. 10, 2026

(54) SEMICONDUCTOR DEVICE INCLUDING ELEMENT ISOLATION INSULATING FILM HAVING THERMAL OXIDE FILM

(71) Applicant: DENSO CORPORATION, Kariya-city (JP)

(72) Inventors: Syogo Ikeura, Kariya-city (JP); Takashi Nakano, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 577 days.

(21) Appl. No.: 18/062,360

(22) Filed: Dec. 6, 2022

(65) Prior Publication Data

US 2023/0098207 A1 Mar. 30, 2023

Related U.S. Application Data

(63) Continuation of application No. PCT/JP2021/019669, filed on May 24, 2021.

(30) Foreign Application Priority Data

Jun. 16, 2020 (JP) ................................. 2020-103997

(51) Int. Cl.
*H10D 62/10* (2025.01)
*H01L 21/225* (2006.01)
(Continued)

(52) U.S. Cl.
CPC ....... *H10D 62/115* (2025.01); *H01L 21/2253* (2013.01); *H01L 21/26513* (2013.01);
(Continued)

(58) Field of Classification Search
CPC .... H10D 62/115; H10D 10/061; H10D 10/60; H10D 64/111; H01L 21/2253; H01L 21/26513; H01L 21/266; H01L 21/76283
See application file for complete search history.

(56) References Cited

U.S. PATENT DOCUMENTS

| 2002/0063753 | A1* | 5/2002 | Kubota ................. B41J 2/1631 |
| | | | 347/57 |
| 2016/0240633 | A1 | 8/2016 | Ohnishi |
| 2017/0236818 | A1 | 8/2017 | Ohnishi |

FOREIGN PATENT DOCUMENTS

| JP | 2000-183073 A | 6/2000 |
| JP | 2000-275129 A | 10/2000 |

(Continued)

*Primary Examiner* — Norman D Richards
*Assistant Examiner* — Sammantha K Salaz
(74) *Attorney, Agent, or Firm* — Posz Law Group, PLC

(57) ABSTRACT

A semiconductor device includes a semiconductor substrate, a base region, an emitter region, a collector region, and an element isolation insulating film. The semiconductor substrate has a main surface. The base region has a first conductivity type and is disposed in a surface layer of the semiconductor substrate that is close to the main surface. The emitter region has a second conductivity type and is disposed in a surface layer of the base region. The collector region has the second conductivity type and is disposed at a portion in the surface layer of the semiconductor substrate apart from the emitter region. The element isolation insulating film is disposed on the main surface, and has a thermal oxide film being in contact with a junction interface between the base region and the emitter region.

6 Claims, 6 Drawing Sheets

(51) Int. Cl.
| | | |
|---|---|---|
| *H01L 21/265* | (2006.01) | |
| *H01L 21/266* | (2006.01) | |
| *H01L 21/762* | (2006.01) | |
| *H10D 10/01* | (2025.01) | |
| *H10D 10/60* | (2025.01) | |
| *H10D 64/00* | (2025.01) | |

(52) U.S. Cl.
CPC ...... *H01L 21/266* (2013.01); *H01L 21/76283* (2013.01); *H10D 10/061* (2025.01); *H10D 10/60* (2025.01); *H10D 64/111* (2025.01)

(56) References Cited

FOREIGN PATENT DOCUMENTS

| | | | |
|---|---|---|---|
| JP | 2003-318188 | A | 11/2003 |
| JP | 2004-140235 | A | 5/2004 |
| JP | 2010-114292 | A | 5/2010 |

* cited by examiner

SEMICONDUCTOR DEVICE INCLUDING ELEMENT ISOLATION INSULATING FILM HAVING THERMAL OXIDE FILM

CROSS REFERENCE TO RELATED APPLICATIONS

The present application is a continuation application of International Patent Application No. PCT/JP2021/019669 filed on May 24, 2021, which designated the U.S. and claims the benefit of priority from Japanese Patent Application No. 2020-103997 filed on Jun. 16, 2020. The entire disclosures of all of the above applications are incorporated herein by reference.

TECHNICAL FIELD

The present disclosure relates to a semiconductor device and a manufacturing method of a semiconductor device.

BACKGROUND

JP 2010-114292 A discloses a semiconductor device including a bipolar transistor. The disclosure of JP 2010-114292 A is incorporated herein by reference as an explanation of technical elements in the present disclosure.

SUMMARY

The present disclosure provides a semiconductor device including a semiconductor substrate, a base region, an emitter region, a collector region, and an element isolation insulating film. The semiconductor substrate has a main surface. The base region has a first conductivity type and is disposed in a surface layer of the semiconductor substrate that is close to the main surface. The emitter region has a second conductivity type and is disposed in a surface layer of the base region. The collector region has the second conductivity type and is disposed at a portion in the surface layer of the semiconductor substrate apart from the emitter region. The element isolation insulating film is disposed on the main surface, and has a thermal oxide film being in contact with a junction interface between the base region and the emitter region.

The present disclosure also provides a manufacturing method of a semiconductor device in which a junction interface between a base region and an emitter region is in contact with a thermal oxide film in an element isolation insulating film.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
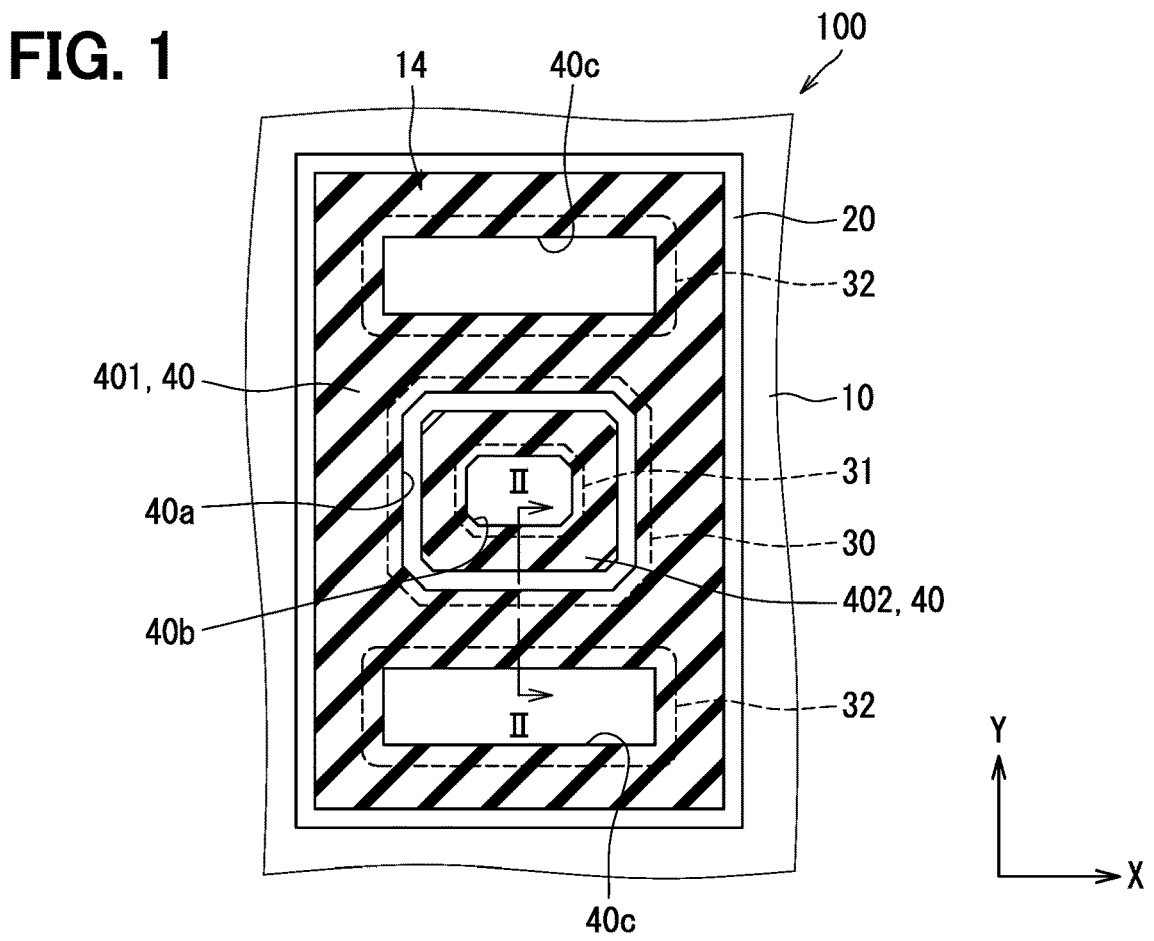
FIG. 1 is a plan view illustrating a schematic configuration of a semiconductor device according to a first embodiment.

A semiconductor device including a bipolar transistor has a salicide layer on an emitter region and on a contact region in a base region. On the base region, a salicide protector layer to restrict the formation of the salicide layer is formed around the salicide layer. A junction interface between the base region and the emitter region is in contact with the salicide protector layer. The semiconductor device having the above-described configuration has a low current amplification factor. From the above-described viewpoint or from other viewpoints not mentioned, further improvement is required for the semiconductor device.

A semiconductor device according to an aspect of the present disclosure includes a semiconductor substrate, a base region, an emitter region, a collector region, and an element isolation insulating film. The semiconductor substrate has a main surface. The base region has a first conductivity type and is disposed in a surface layer of the semiconductor substrate that is close to the main surface. The emitter region has a second conductivity type reverse to the first conductivity type and is disposed in a surface layer of the base region. The collector region has the second conductivity type and is disposed at a portion in the surface layer of the semiconductor substrate apart from the emitter region. The element isolation insulating film is disposed on the main surface, and has a thermal oxide film being in contact with a junction interface between the base region and the emitter region.

In the semiconductor device described above, the element isolation insulating film is disposed on the main surface of the semiconductor substrate. The junction interface between the base region and the emitter region is in contact with the thermal oxide film of the element isolation insulating film. This makes it possible to restrict a collector current from being trapped by crystal defects. As a result, the semiconductor device can have a high current amplification factor.

In a manufacturing method of a semiconductor device according to another aspect of the present disclosure, an element isolation insulating film having an opening and having a thermal oxide film is formed on a main surface of a semiconductor substrate. Impurity ions of a first conductivity type and impurity ions of a second conductivity type reverse to the first conductivity type are sequentially implanted at a portion exposed from the opening of the element isolation insulating film using a common photomask. The impurity ions of the first conductivity type and the impurity ions of the second conductivity type are diffused by heat treatment to form a base region and an emitter region such that a junction interface between the base region and the emitter region is in contact with the thermal oxide film.

According to the manufacturing method described above, the junction interface between the base region and the emitter region is in contact with the thermal oxide film of the element isolation insulating film. Therefore, the semiconductor device with a high current amplification factor can be manufactured. In addition, the impurity ions for forming the base region and the impurity ions for forming the emitter region are implanted using the common photomask. Therefore, the semiconductor device with a high current conversion rate can be manufactured at low cost.

Hereinafter, multiple embodiments will be described with reference to the drawings. In some embodiments, parts that are functionally and/or structurally corresponding to each other and/or associated with each other are given the same reference numerals. For corresponding parts and/or associated parts, additional explanations can be made to the description of other embodiments.

First Embodiment

In the present embodiment, a semiconductor device including an npn-type bipolar transistor will be described as an example. In the present embodiment, a p-type corresponds to a first conductivity type, and an n-type corresponds to a second conductivity type reverse to the first conductivity type.

<Semiconductor Device>

Figure 2:
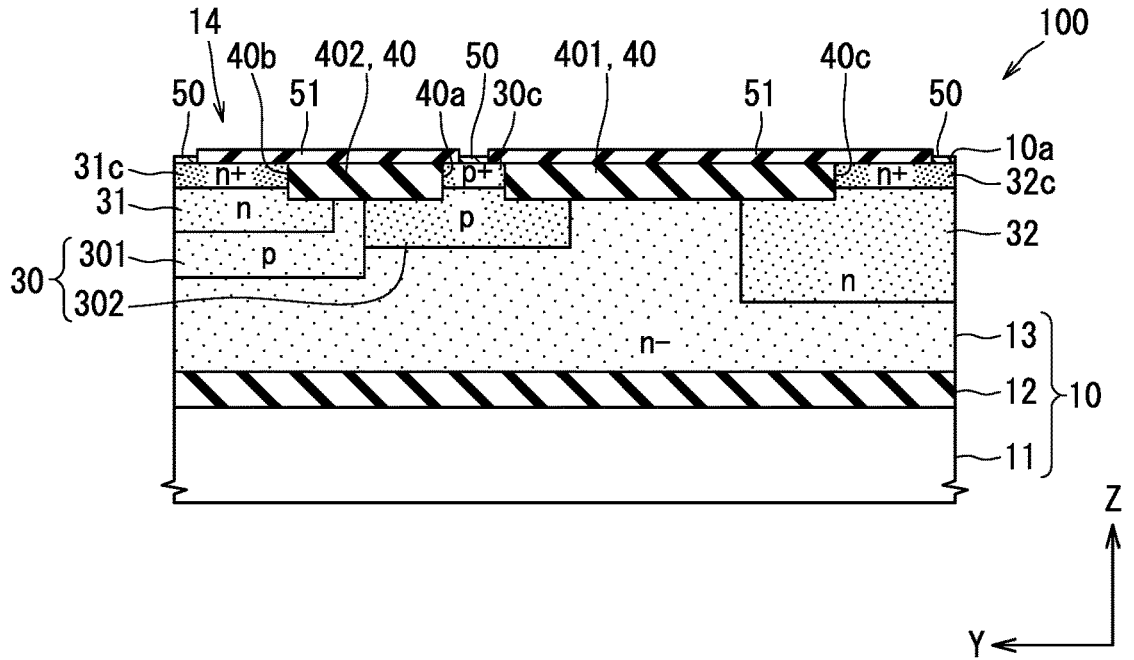
FIG. 2 is a cross-sectional view of the semiconductor device taken along line II-II of FIG. 1.
Figure 3:
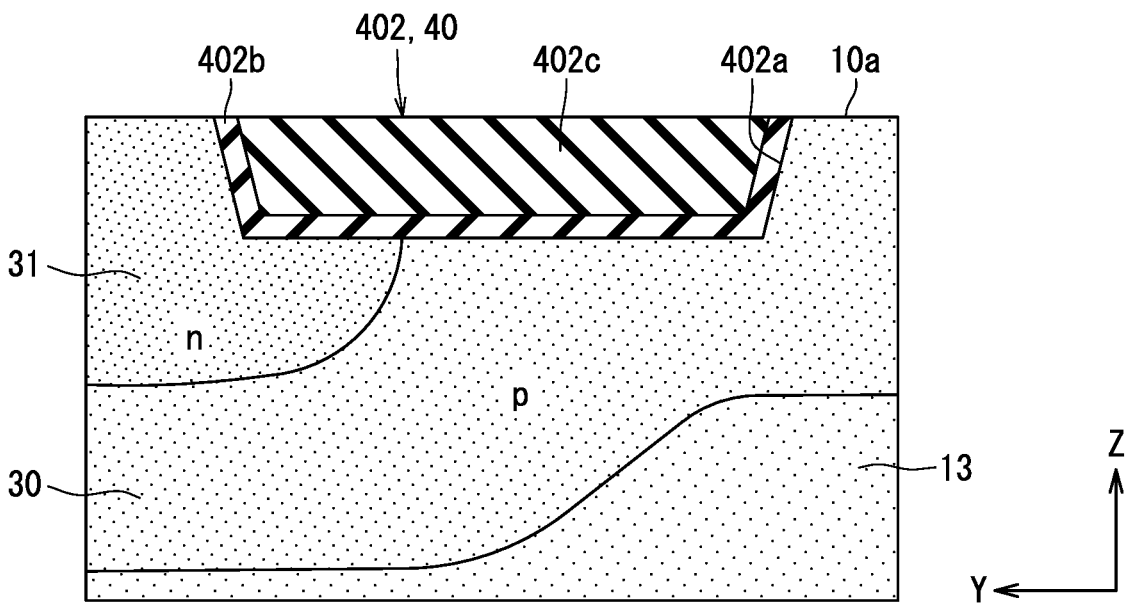
FIG. 3 is a cross-sectional view illustrating a periphery of a shallow trench isolation section.

A schematic configuration of the semiconductor device will be described with reference to FIGS. 1, 2, and 3. FIG. 1 is a plan view of the semiconductor device. FIG. 1 shows a positional relationship between a base region, an emitter region, collector regions, and a shallow trench isolation (STI) section. In FIG. 1, some elements of the semiconductor device such as a silicide layer are omitted for convenience. In FIG. 1, the STI section is hatched for clarity. FIG. 2 is a cross-sectional view of the semiconductor device taken along line II-II of FIG. 1. FIG. 3 is a cross-sectional view illustrating a periphery of a second isolation portion in the STI section. In FIG. 3, the base region and the emitter region are simplified. The silicide layer and a silicide block layer are omitted in the drawings.

Hereinafter, a thickness direction of a semiconductor substrate is defined as a Z direction. A direction orthogonal to the Z direction and in which the emitter region and the collector regions are arranged is defined as a Y direction. A direction orthogonal to both the Z direction and the Y direction is defined as an X direction. Unless otherwise specified, a shape viewed in a plane from the Z-direction, that is, a shape along an XY plane defined by the X-direction and Y-direction is referred to as a planar shape. The plan view from the Z direction may be simply referred to as a plan view.

As shown in FIGS. 1 and 2, the semiconductor device 100 includes a semiconductor substrate 10, a trench isolation portion 20, a base region 30, an emitter region 31, collector regions 32, and an STI section 40.

The semiconductor substrate 10 has a support substrate 11, a buried insulating film 12 and an active layer 13. The support substrate 11 is composed of an n⁻-type silicon substrate, for example. The buried insulating film 12 is composed of a silicon oxide film or the like, and is disposed on one surface of the support substrate 11. The buried insulating film 12 has a thickness of several μm, for example, in order to ensure insulation between the support substrate 11 and the active layer 13. The active layer 13 is laminated above the support substrate 11 with the buried insulating film 12 interposed therebetween. The active layer 13 of the present embodiment is an n-type semiconductor layer formed by implanting n-type impurity ions into a p-type semiconductor layer.

Thus, in the present embodiment, a silicon on insulator (SOI) substrate is used as the semiconductor substrate 10. The semiconductor substrate 10 has a main surface 10a including a surface of the active layer 13.

The trench isolation portion 20 divides the active layer 13 into an element region 14 and a region other than the element region 14. The trench isolation portion 20 isolates the active layer 13. The region other than the element region 14 is, for example, a field ground region.

The trench isolation portion 20 is formed by embedding an insulating film in a trench (groove) formed to reach the buried insulating film 12 from the main surface 10a, that is, the surface of the active layer 13. The insulating film is disposed in the trench by thermal oxidation and/or embedding an insulating material by deposition.

The base region 30, the emitter region 31 and the collector regions 32 are impurity diffusion regions that form the bipolar transistor. These diffusion regions are formed in the element region 14 described above. As shown in FIG. 1, the element region 14 that constitutes the bipolar transistor has a substantially rectangular planer shape with the Y direction as a longitudinal direction and the X direction as a lateral direction.

The base region 30 of p-type is formed in a central portion of the element region 14. The base region 30 is formed in a surface layer of the active layer 13 that is close to the main surface 10a. The base region 30 has a first region 301 and a second region 302. The first region 301 is a region formed by ion implantation through an opening 40b, which will be described later. The second region 302 is a region formed by ion implantation from an opening 40a. The first region 301 is a region provided directly below the emitter region 31. The first region 301 encloses the emitter region 31. The second region 302 is a region provided to surround the first region 301. The second region 302 is a region extending from the first region 301 toward the collector region 32 in the Y direction. The second region 302 has an impurity concentration higher than an impurity concentration of the first region 301. A bottom surface of the second region 302 is located at a depth shallower than a bottom surface of the first region 301 with reference to the main surface 10a. Since the second region 302 is a region that draws out the base region 30 to a side closer to the collector region 32, the second region 302 is sometimes called a base drawer region. A bottom surface of the second region 302 is located at a depth shallower than a bottom surface of the first region 301 with reference to the main surface 10a.

The base region 30 has a contact region 30c of p⁺-type. The contact region 30c is exposed from the main surface 10a and has an impurity concentration higher than that of a remaining region of the base region 30 other than the contact region 30c. The contact region 30c of the present embodiment is formed in a surface layer of the second region 302. The contact region 30c is formed at a position overlapping the opening 40a in plan view.

The emitter region 31 of n-type is formed in a surface layer of the base region 30 at a position apart from the contact region 30c. The emitter region 31 terminates in the base region 30. The emitter region 31 has a contact region 31$c$ of n$^+$-type. The contact region 31$c$ is exposed from the main surface 10$a$ and has an impurity concentration higher than that of a remaining region of the emitter region 31 other than the contact region 31$c$.

The emitter region 31 of the present embodiment is formed in the central portion of the element region 14. The base region 30 is formed to enclose the emitter region 31 in plan view. The contact region 31$c$ is formed at a position overlapping the opening 40$b$ in plan view.

The collector region 32 of n-type has a higher impurity concentration than the active layer 13. The collector region 32 is formed at a position apart from the emitter region 31 in the surface layer of the main surface 10$a$. The collector regions 32 of the present embodiment are formed near both ends in the Y direction in the element region 14 having the substantially rectangular plane shape. The two collector regions 32 are provided so as to sandwich the emitter region 31 and the base region 30 in the Y direction. The alignment direction of the base region 30 or the emitter region 31 and the collector regions 32 is substantially parallel to the Y direction.

Each of the collector regions 32 includes a contact region 32$c$ of n$^+$-type. The contact region 32$c$ is exposed from the main surface 10$a$ and has an impurity concentration higher than that of a remaining region of the collector region 32 other than the contact region 32$c$. In the present embodiment, the contact region 32$c$ is formed at a position overlapping the opening 40$c$ in plan view. The collector region 32 is formed to a position deeper than the base region 30.

The STI section 40 is formed on the surface layer of the active layer 13 in the element region 14. As shown in FIG. 3, the STI section 40 is formed by forming a trench 402$a$ with a predetermined depth in the surface layer of the active layer 13 from the main surface 10$a$, filling the trench 402$a$ with an insulating film, and planarizing the insulating film by chemical mechanical polishing (CMP), for example.

Specifically, a thermal oxide film 402$b$ is formed on the surface of the active layer 13 in the trench 402$a$. In addition, a CVD oxide film 402$c$ is formed on the thermal oxide film 402$b$. The thermal oxide film 402$b$ covers inner walls of the trench 402$a$, and the rest of the trench 402$a$ is filled with CVD oxide film 402$c$. Thus, the STI section 40 is formed by the thermal oxide film 402$b$ and the CVD oxide film 402$c$. Although FIG. 3 shows a structure of a second isolation portion 402 as the STI section 40, a first isolation section 401 has a similar structure. The STI section 40 may have a silicon nitride film between the thermal oxide film 402$b$ and the CVD oxide film 402$c$.

The STI section 40 has openings for exposing contact regions. The STI section 40 of the present embodiment has the openings 40$a$, 40$b$, and 40$c$. In the element region 14, the STI section 40 is provided at a region except for the openings 40$a$ to 40$c$.

The opening 40$a$ is formed to expose the contact region 30$c$ of the base region 30. The opening 40$a$ has a frame shape. The opening 40$b$ is formed to expose the contact region 31$c$ of the emitter region 31. The opening 40$b$ is surrounded by the opening 40$a$ having the frame shape. The openings 40$c$ are formed to expose the contact regions 32$c$ of the collector regions 32. The STI section 40 has the two openings 40$c$.

The STI section 40 is divided into the first isolation portion 401 and the second isolation portion 402 by the opening 40$a$ having the frame shape. The opening 40$c$ is formed in the first isolation portion 401 and the opening 40$b$ is formed in the second isolation portion 402. The second isolation portion 402 has an annular shape due to the openings 40$a$ and 40$b$. The first isolation portion 401 overlaps a part of the collector region 32 and a part of the base region 30 in plan view. The second isolation portion 402 overlaps a part of the emitter region 31 and a part of the base region 30 in plan view. The second isolation portion 402 of the STI section 40 corresponds to an element isolation insulating film.

The semiconductor device 100 of the present embodiment further includes a silicide layer 50 and a silicide block layer 51. The silicide layer 50 reduces contact resistance with a wiring portions (not shown) arranged on the main surface 10$a$. The silicide block layer 51 is formed to restrict the formation of the silicide layer 50, that is, silicidation. The silicide block layer 51 is composed of, for example, a CVD oxide film. The silicide layer 50 is formed in openings of the silicide block layer 51.

The silicide layer 50 is formed on each of the contact regions 30$c$, 31$c$ and 32$c$ of the base region 30, the emitter region 31 and the collector regions 32. The silicide layer 50 is composed of cobalt silicon (CoSi), for example. The silicide layer 50 is sometimes referred to as a salicide layer. The silicide block layer 51 is sometimes called a salicide block layer, a salicide protector layer, or the like.

Although illustration is omitted, the semiconductor device 100 further includes the wiring portions and an insulating film arranged on the main surface 10$a$. The wiring portions are electrically connected to the corresponding diffusion regions through the silicide layer 50.

As described above, in the present embodiment, the npn-type bipolar transistor is formed in the element region 14 of the semiconductor substrate 10. The structure formed in the element region 14 has approximately two-fold symmetry around an axis passing through the center of the element region 14 and parallel to the Z-axis.

<Relationship between Base Region, Emitter Region, and STI Section>

Next, a relationship between the base region 30, the emitter region 31, and the STI section 40 in the semiconductor device 100 will be described.

As described above, in the present embodiment, the STI section 40 (the second isolation portion 402) is formed across both the base region 30 and the emitter region 31 so as to straddle the boundary between the base region 30 and the emitter region 31 on the main surface 10$a$.

As shown in FIG. 1, the base region 30 is provided so as to overlap the openings 40$a$ and 40$b$, the entire area of the second isolation portion 402, and a part of the first isolation portion 401 in plan view. As shown in FIG. 2, the second region 302 of the base region 30 is in contact with a bottom surface of the first isolation portion 401 and a bottom surface of the second isolation portion 402.

The emitter region 31 is provided so as to overlap the opening 40$b$ and a part of the second isolation portion 402 in plan view. The emitter region 31 extends to a position in contact with the bottom surface of second isolation portion 402.

That is, as shown in FIG. 3, a junction interface between the base region 30 and the emitter region 31 is in contact with the bottom surface of the second isolation portion 402 of the STI section 40. An end portion of the junction interface that is close to the main surface 10$a$ is in contact with the thermal oxide film 402$b$ of the second isolation portion 402.

<Manufacturing Method of Semiconductor Device>

Next, a manufacturing method the semiconductor device 100 will be described with reference to FIGS. 3 to 8. FIG.

Figure 8:
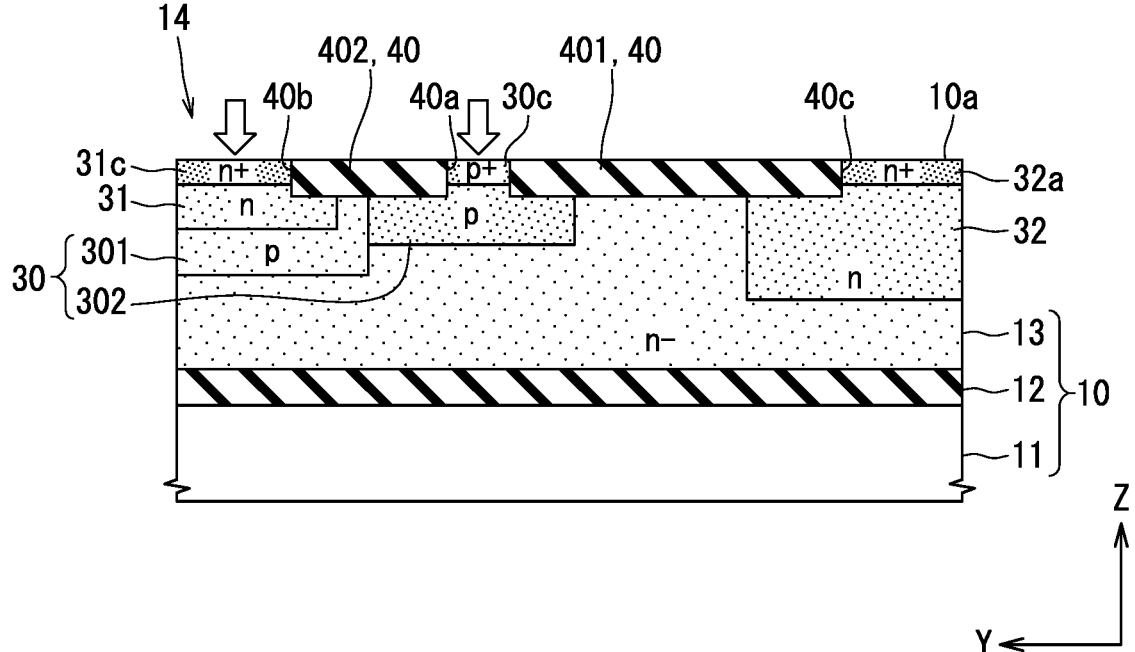
FIG. 8 is a cross-sectional view illustrating a process in the manufacturing method of the semiconductor device subsequent to the process illustrated in FIG. 7.

4 to FIG. 8 illustrates a part of the semiconductor device corresponding to a part illustrated in FIG. 2.

First, the semiconductor substrate 10 described above is prepared. Then, the STI section 40 is formed in the surface layer of the active layer 13 close to the main surface 10a. As shown in FIG. 3, after forming the trench 402a, the STI section 40 is formed by forming the thermal oxide film 402b and the CVD oxide film 402c to fill the trench 402a.

Figure 4:
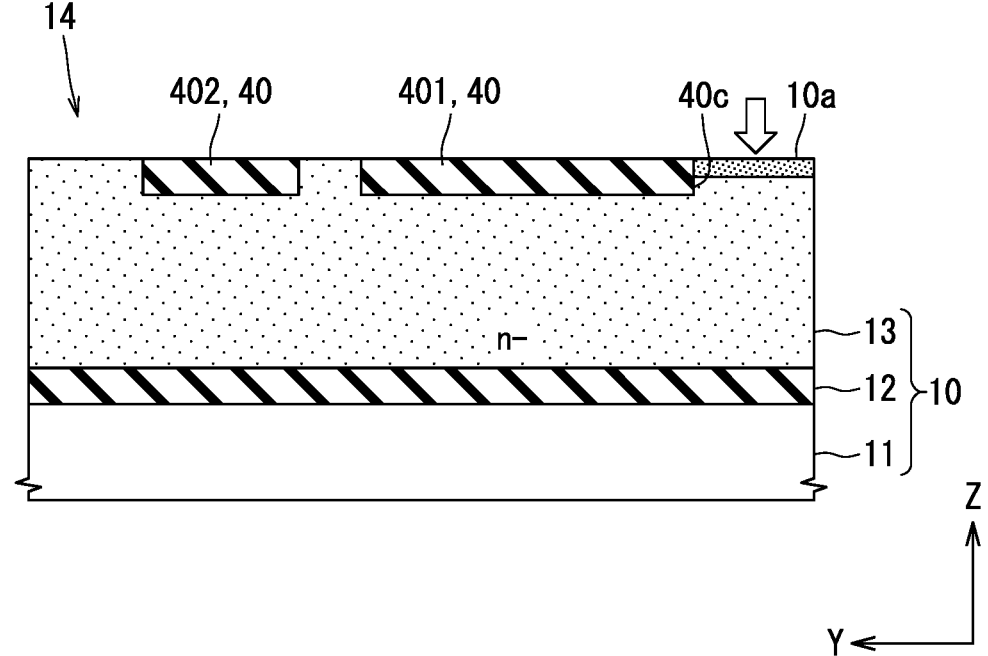
FIG. 4 is a cross-sectional view illustrating a process in a manufacturing method of the semiconductor device.

Then, in order to form the collector regions 32, as shown in FIG. 4, n-type impurity ions such as phosphorus (P) ions is are implanted into the surface layer of the active layer 13 close to the main surface 10a. At this time, the impurity ions are implanted into a portion of the STI section 40 exposed from the opening 40c.

Figure 5:
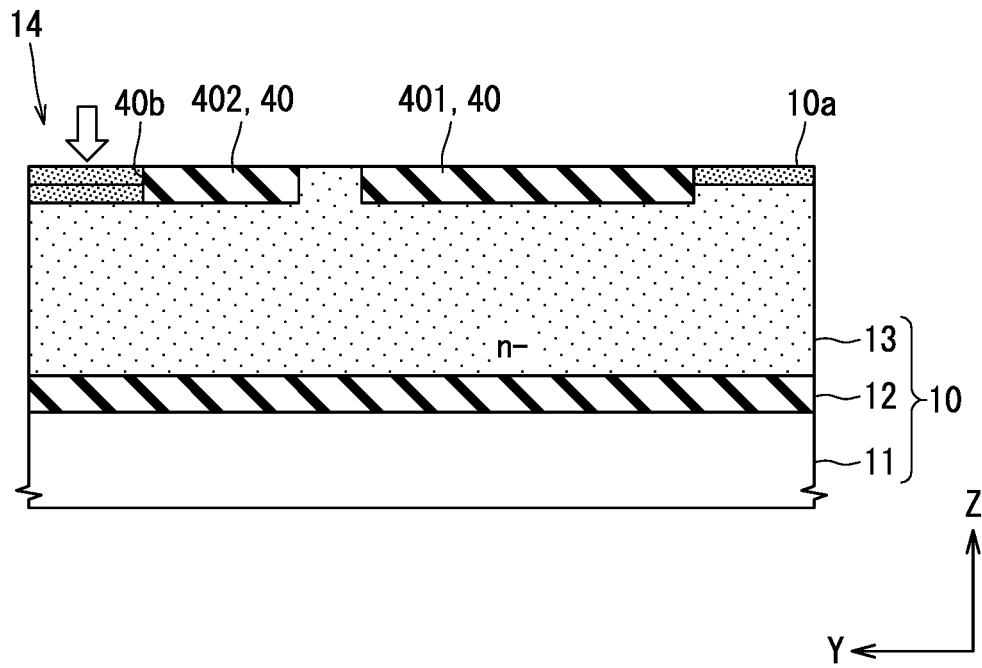
FIG. 5 is a cross-sectional view illustrating a process in the manufacturing method of the semiconductor device subsequent to the process illustrated in FIG. 4.

Next, in order to form the base region 30 and the emitter region 31, as shown in FIG. 5, p-type impurity ions such as boron (B) ions are implanted into the surface layer of the active layer 13 that is close to the main surface 10a, and then n-type impurity ions such as arsenic (As) ions are implanted. At this time, the impurity ions are implanted into a portion of the STI section 40 exposed from the opening 40b. In the above process, the p-type impurity ions and the n-type impurity ions are sequentially implanted using a common photomask.

Figure 6:
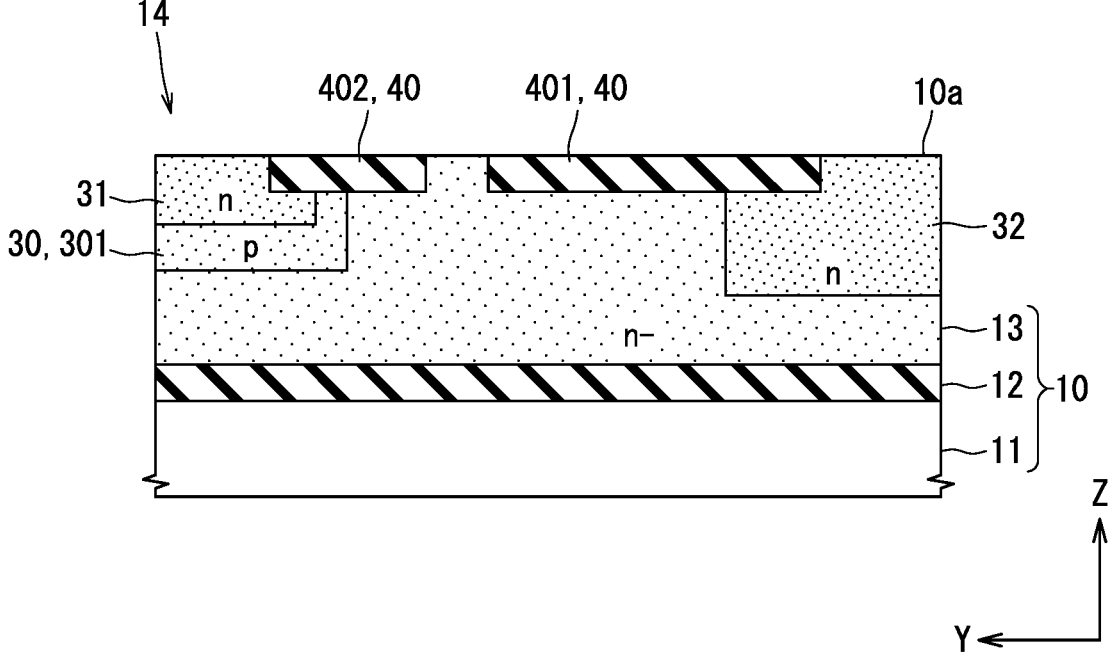
FIG. 6 is a cross-sectional view illustrating a process in the manufacturing method of the semiconductor device subsequent to the process illustrated in FIG. 5.

Then, by heat treatment, the impurity ions are diffused as shown in FIG. 6. By this heat treatment, the first region 301 of the base region 30, the emitter region 31 and the collector region 32 are formed.

Figure 7:
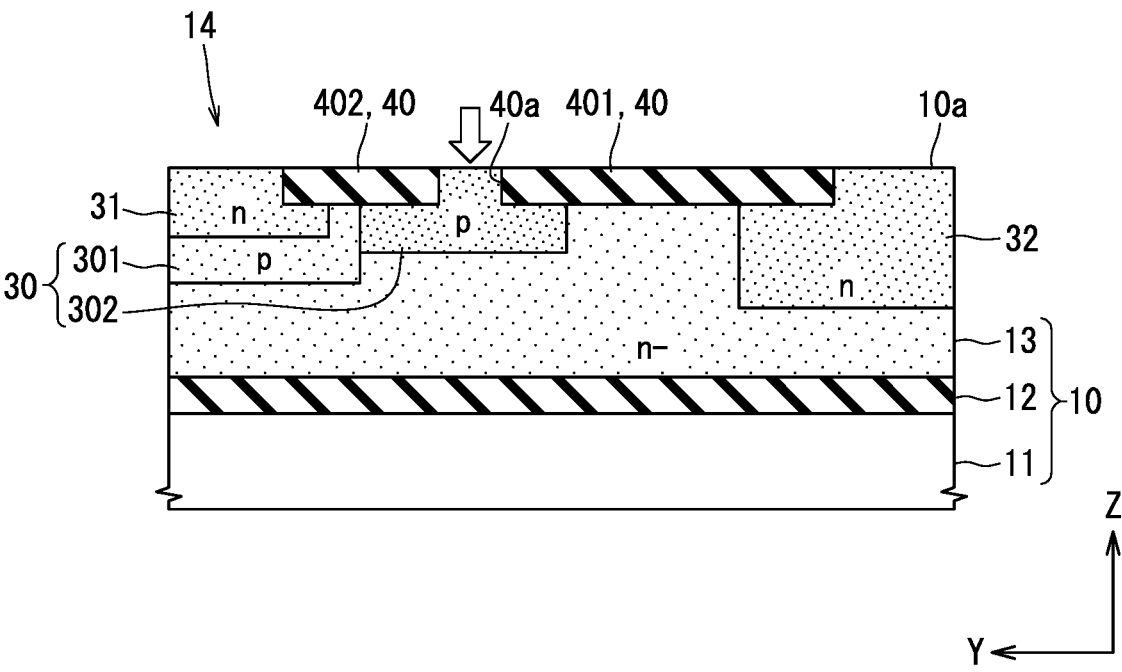
FIG. 7 is a cross-sectional view illustrating a process in the manufacturing method of the semiconductor device subsequent to the process illustrated in FIG. 6.

Next, in order to form the second region 302 of the base region 30, as shown in FIG. 7, p-type impurity ions such as boron ions are implanted into the surface layer of the active layer 13 that is close to the main surface 10a. At this time, the impurity ions are implanted into a portion of the STI section 40 exposed from the opening 40a.

Next, as shown in FIG. 8, corresponding impurity ions are implanted into portions of the surface layer of the active layer 13 that is close to the main surface 10a and exposed from the openings 40a, 40b, and 40c of the STI section 40. P-type impurity ions such as boron ions are implanted into the portion exposed from the opening 40a. N-type impurity ions such as arsenic ions are implanted into the portion exposed from the opening 40b. N-type impurity ions such as phosphorus are implanted into the portion exposed from the opening 40c. The contact regions 30c, 31c, and 32c are formed by the above-described ion implantation.

After that, although not shown, the silicide layer 50 is formed. Furthermore, the wiring portions and the insulating film are formed. The semiconductor device 100 can be manufactured by the above-described manufacturing method. The order of the ion implantation for forming the collector regions 32 and the ion implantation for forming the base region 30 and the emitter region 31 may be changed.

Summary of First Embodiment

In the present embodiment, the STI section 40 (the second isolation portion 402) is disposed at the boundary between the base region 30 and the emitter region 31 on the main surface 10a of the semiconductor substrate 10. The STI section 40 has the thermal oxide film 402b on the surface of the trench 402a. By providing the thermal oxide film 402b, crystal defects generated in the semiconductor substrate 10 by ion implantation or the like are taken into the thermal oxide film 402b.

The thermal oxide film 402b is in contact with the junction interface between the base region 30 and the emitter region 31. This makes it possible to restrict a collector current from being trapped by the crystal defects. Therefore, it is possible to provide the semiconductor device 100 with a high current amplification factor. The current amplification factor hFE is a value obtained by dividing the collector current by the base current.

Figure 9:
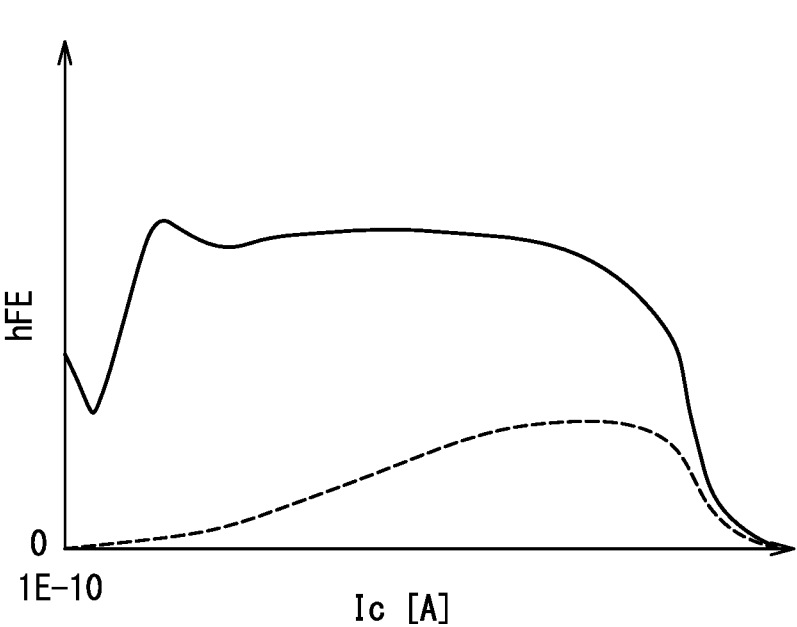
FIG. 9 is a diagram showing a relationship between a collector current and a current amplification factor.

FIG. 9 is a diagram showing a relationship between the collector current and the current amplification factor. FIG. 9 shows the average values of the results of 50 tests at room temperature. A solid line indicates the result of the configuration of the present embodiment, and a dashed line indicates the result of a reference example. In the reference example, no STI section was provided, and the junction interface between the base region and the emitter region was in contact with a CVD oxide film forming a silicide block layer. The other configuration of the reference example is same as the configuration of the present embodiment.

As seen from the experimental results shown in FIG. 9, it is clear that the configuration of the present embodiment can improve the current amplification factor hFE. In particular, the current amplification factor hFE can be improved in a low current region of the collector current Ic.

The above configuration can be formed by the following first to third processes. In the first process, the STI section 40 (the second isolation portion 402) having the thermal oxide film 402b is formed on the main surface 10a of the semiconductor substrate 10. In the second process, in order to form the base region 30 (the first region 301) and the emitter region 31, the p-type conductivity impurity ions are implanted to the portion of the STI section 40 exposed from the opening 40b, and then the n-type conductivity type impurity ions are implanted using the common photomask. In the third process, the impurity ions are diffused by heat treatment to form the base region 30 (the first region 301) and the emitter region 31 such that the junction interface between base region 30 and the emitter region 31 is in contact with thermal oxide film 402b. In this way, the impurity ions for forming the base region 30 and the impurity ions for forming the emitter region 31 are sequentially implanted using the common photomask. Therefore, the semiconductor device 100 with a high current amplification factor hFE can be manufactured at low cost.

A contact position between the thermal oxide film 402b and the junction interface between the base region 30 and the emitter region 31 is not particularly limited. In the present embodiment, the junction interface between the base region 30 and the emitter region 31 is in contact with the bottom surface of the second isolation portion 402. That is, the emitter region 31 extends to the lower region of the second isolation portion 402. Since the junction interface is in contact with the thermal oxide film 402b at the bottom surface of the second isolation portion 402, the hFE characteristics can be stabilized.

Figure 10:
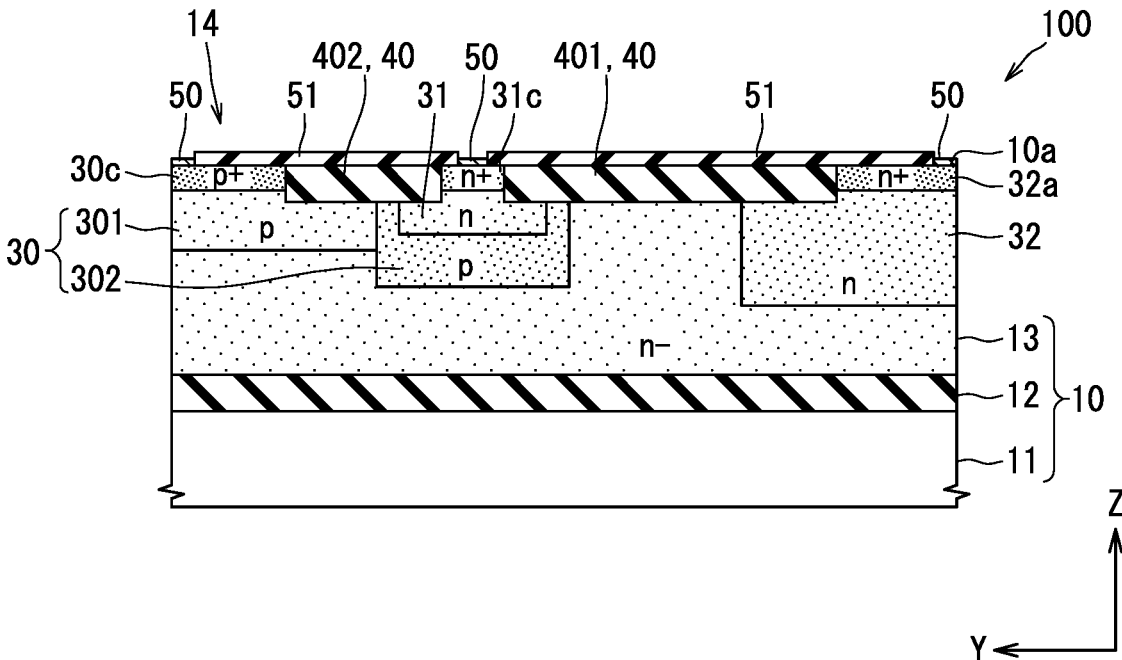
FIG. 10 is a cross-sectional view illustrating a semiconductor device according to a modification.

The base region 30 may be provided so as to enclose at least the emitter region 31. For example, as in a modification shown in FIG. 10, the contact region 31c of the emitter region 31 may be provided between the contact region 30c of the base region 30 and the contact region 32c of the collector region 32. In this configuration, the first region 301 having a low impurity concentration is provided in a region that is close to the collector region 32.

In the present embodiment, the second region 302 having the high impurity concentration extends from the first region 301 toward the collector region 32. In the base region 30, the impurity concentration directly below the emitter region 31 is low, and the impurity concentration at an end portion close to the collector region 32 is high. This stabilizes the path of the collector current Ic, thereby stabilizing the hFE characteristics.

Second Embodiment

A second embodiment is a modification of the preceding embodiment as a basic configuration and may incorporate description of the preceding embodiment. In the preceding embodiment, the arrangement of the wiring portions is not particularly mentioned. The positions of the base region and the wiring portion connected to the base region may be in a predetermined relationship.

Figure 11:
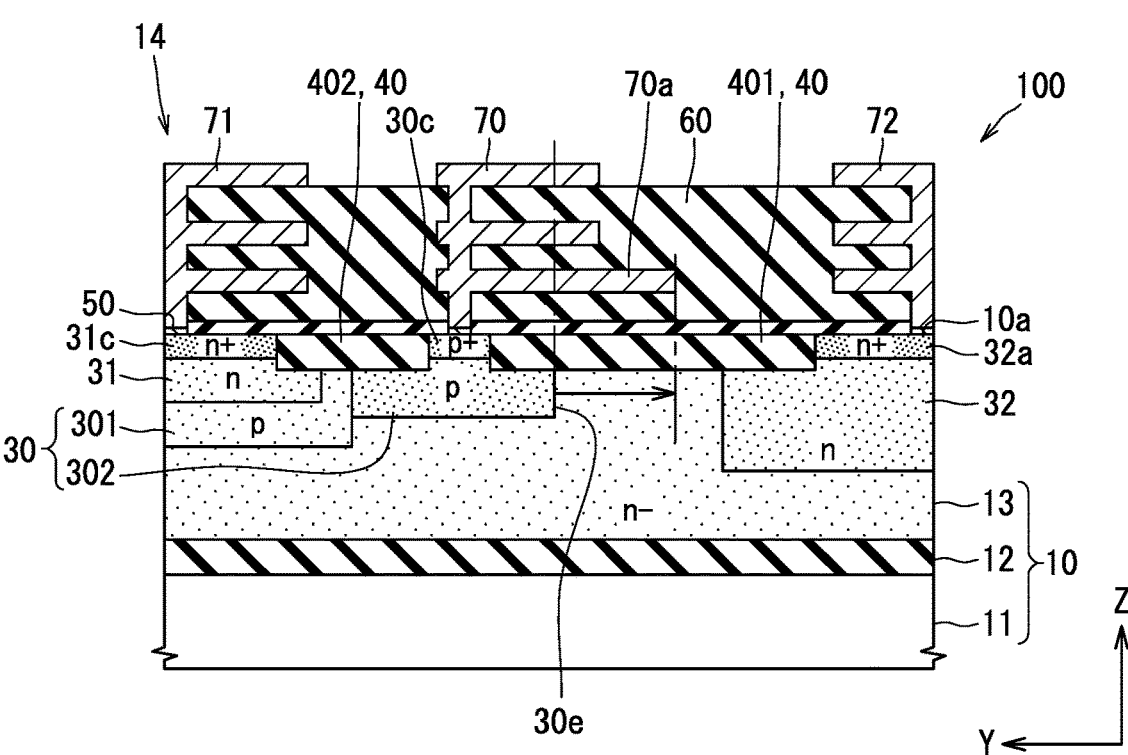
FIG. 11 is a cross-sectional view illustrating a semiconductor device according to a second embodiment.
Figure 12:
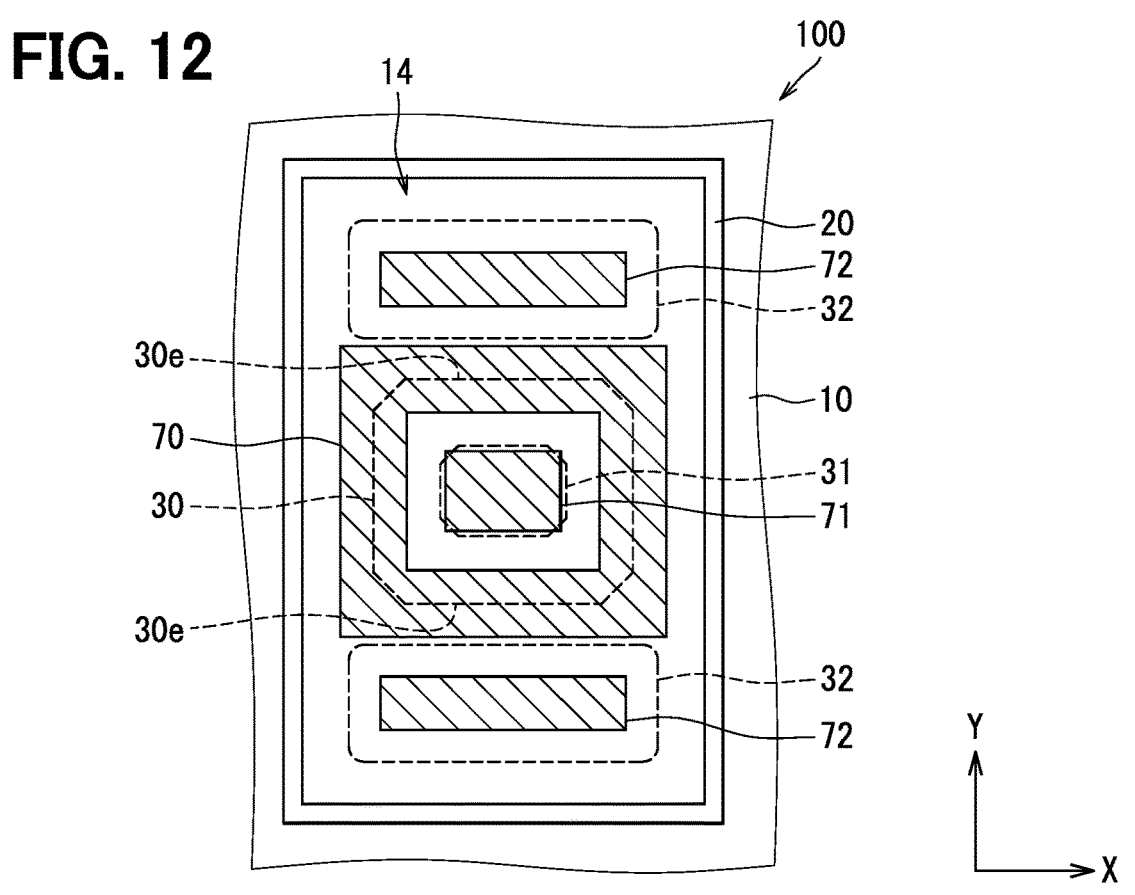
FIG. 12 is a plan view illustrating an arrangement of wiring portions.

FIGS. 11 and 12 illustrates a semiconductor device 100 according to the second embodiment. FIG. 11 is a cross-sectional view corresponding to FIG. 2 of the preceding embodiment. FIG. 12 is a plan view showing the semiconductor device. FIG. 12 shows the positional relationship between the diffusion regions and the wiring portions. For the sake of convenience, FIG. 12 omits some of the elements constituting the semiconductor device 100, such as the STI section 40, the silicide layer 50, the silicide block layer 51, and an insulating film 60. In FIG. 12, the wiring portions are hatched for clarity.

The semiconductor device 100 includes the insulating film 60 and wiring portions 70, 71, 72 arranged on the insulating film 60 in addition to the configuration described in the preceding embodiment (see FIG. 2). The wiring portions 70, 71, 72 are formed using metal such as aluminum. The wiring portion 70 is electrically connected to the contact region 30c of the base region 30. The wiring portion 71 is electrically connected to the contact region 31c of the emitter region 31. The wiring portions 72 are electrically connected to the contact regions 32c of the collector regions 32.

The wiring portion 70 connected to the base region 30 extends to positions closer to the collector regions 32 than end portions 30e of the base region 30 close to the collector region 32 in plan view.

In the present embodiment, the wiring portions 70, 71, and 72 are arranged in multiple layers with respect to the insulating film 60 arranged on the main surface 10a. The insulating film 60 includes an interlayer insulating film. The wiring portion 70 of the base region 30 surrounds the wiring portion 71 of the emitter region 31. The wiring portion 70 has an annular shape in plan view. The wiring portions 72 of the collector regions 32 are positioned right above the collector regions 32. The wiring portion 70 is arranged between the wiring portions 71 and 72 in the Y direction.

The wiring portion 70 has a wiring 70a. The wiring 70a is an inner layer wiring closest to the main surface 10a among multilayer wirings that form the wiring portion 70. In the wiring portion 70 having the annular shape, inner peripheral ends of all of the multilayer wirings including the wiring 70a substantially coincides with each other in plan view. On the other hand, an outer peripheral end of the wiring 70a extends outward more than outer peripheral ends of the wirings of the other layers in the wiring portion 70 at least in the Y direction. The outer peripheral end of the wiring portion 70 shown in FIG. 12 is the outer peripheral end of the wiring 70a. The wiring 70a corresponds to a first wiring and the wirings of the other layers correspond to second wirings.

In the present embodiment, the wirings of all the layers forming the wiring portion 70 extend toward the collector regions 32 more than the end portions 30e of the base region

30 in the Y direction. The wiring 70a extends outward more than the wirings of the other layers over the entire circumference.

Summary of Second Embodiment

In the present embodiment, as described above, the wiring portion 70 extends to the positions closer to the collector regions 32 than the end portions 30e of the base region 30 close to the collector regions 32 in plan view. In particular, in the wiring portion 70, the wiring 70a extends closer to the collector regions 32 than the wirings of other layers. The wiring 70a extends farther from the end portions 30e than the wirings of other layers. The wiring portion 70, particularly the wiring 70a, connected to the base region 30 functions as a field plate. As a result, electric field concentration can be relaxed, and the breakdown voltage of the semiconductor device 100 can be improved.

The configuration of the present embodiment can also be combined with the modifications described in the preceding embodiment.

Other Embodiments

The disclosure in this specification, the drawings, and the like is not limited to the exemplified embodiments. The disclosure encompasses the illustrated embodiments and modifications by those skilled in the art based thereon. For example, the disclosure is not limited to the combinations of components and/or elements shown in the embodiments. The disclosure may be implemented in various combinations. The disclosure may have additional portions that may be added to the embodiments. The disclosure encompasses omission of components and/or elements of the embodiments. The disclosure encompasses the replacement or combination of components and/or elements between one embodiment and another. The disclosed technical scopes are not limited to the description of the embodiments. It should be understood that a part of disclosed technical scopes are indicated by claims, and the present disclosure further includes modifications within an equivalent scope of the claims.

The disclosure in the specification, the drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

When an element or a layer is described as "disposed above", "coupled to" "connected to" or "combined with", the element or the layer may be directly disposed above, coupled to, connected to, or combined with another element or another layer, or an intervening element or an intervening layer may be present therebetween. In contrast, when an element is described as "directly disposed on," "directly coupled to," "directly connected to", or "directly combined with" another element or another layer, there are no intervening elements or layers present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatial relative terms "inside", "outside", "back", "bottom", "low", "top", "high", and the like are used herein to facilitate the description that describes relationships between one element or feature and another element or feature. Spatial relative terms can be intended to include different orientations of a device in use or operation, in addition to the orientations illustrated in the drawings. For example, when a device in a drawing is turned over, elements described as "below" or "directly below" other elements or features are oriented "above" the other elements or features. Therefore, the term "below" can include both above and below. The device may be oriented in another direction (rotated 90 degrees or in any other direction) and the spatially relative terms used herein are interpreted accordingly.

Although the example in which the p-type corresponds to the first conductivity type and the n-type corresponds to the second conductivity type has been described, the present disclosure is not limited to this example. The n-type may be the first conductivity type, and the p-type may be the second conductivity type. That is, the present disclosure can also be applied to a pnp bipolar transistor.

The arrangement of the base region 30, the emitter region 31, and the collector regions 32 is not limited to the above-described examples. For example, the collector region 32 may be provided only on one side in the Y direction. The contact region 30c of the base region 30 may be provided between the emitter region 31 and the collector region 32.

Although an example in which the STI section 40 is adopted as an element isolation insulating film having a thermal oxide film has been described, the present disclosure is not limited to this example. For example, a local oxidation of silicon (LOCOS) film may be adopted as an element isolation insulating film having a thermal oxide film. For example, in a fine process such as a 0.18 μm process, the STI section 40 may be preferably adopted.

Although an example in which the base region 30 includes the first region 301 and the second region 302 has been described, the present disclosure is not limited to this example. The base region 30 may have a configuration including only one region.

Although an example in which the SOI substrate is adopted as the semiconductor substrate 10 has been described, the present disclosure is not limited to this example. For example, a bulk substrate may be adopted as the semiconductor substrate 10.

What is claimed is:

1. A semiconductor device comprising:

a semiconductor substrate having a main surface;

a base region having a first conductivity type and disposed in a surface layer of the semiconductor substrate that is close to the main surface;

an emitter region having a second conductivity type reverse to the first conductivity type and disposed in a surface layer of the base region;

a collector region having the second conductivity type and disposed at a portion in the surface layer of the semiconductor substrate that is apart from the emitter region; and an element isolation insulating film disposed on the main surface, and having a thermal oxide film being in contact with a junction interface between the base region and the emitter region, wherein the semiconductor substrate includes an active layer of the second conductivity type that provides the surface layer of the semiconductor substrate, the base region includes a first region and a second region, the first region encloses the emitter region, and the second region extends from the first region toward the collector region and has an impurity concentration higher than an impurity concentration of the first region, a bottom surface of the second region is located at a depth shallower than a bottom surface of the first region with reference to the main surface, and the bottom surface of the second region is in contact with the active layer.

2. The semiconductor device according to claim 1, wherein the junction interface between the base region and the emitter region is in contact with a bottom surface of the element isolation insulating film.

3. The semiconductor device according to claim 1, further comprising a wiring portion disposed on the main surface of the semiconductor substrate and electrically connected to the base region, wherein the wiring portion extends to a position closer to the collector region than an end portion of the base region that is close to the collector region in plan view from a thickness direction of the semiconductor substrate.

4. The semiconductor device according to claim 1, wherein the bottom surface of the second region is entirely in contact with the active layer.

5. The semiconductor device according to claim 1, wherein an entirety of the bottom surface of the second region is in contact with the active layer.

6. The semiconductor device according to claim 1, wherein the second region is separated from the collector region via the active layer.

\* \* \* \* \*